US006930002B1

(12) United States Patent
Chen et al.

(10) Patent No.: US 6,930,002 B1
(45) Date of Patent: Aug. 16, 2005

(54) METHOD FOR PROGRAMMING SINGLE-POLY EPROM AT LOW OPERATION VOLTAGES

(75) Inventors: Chien-Hung Chen, Hsin-Chu (TW); Chungchin Shih, Hsin-Chu County (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/709,370

(22) Filed: Apr. 29, 2004

(51) Int. Cl.[7] ............................................ H01L 21/336
(52) U.S. Cl. ....................... 438/266; 438/197; 438/257
(58) Field of Search ................................ 438/266, 263, 438/264, 257, 258, 197, 259, 201, 202, 289, 438/290, 291, 292

(56) References Cited

U.S. PATENT DOCUMENTS

| | | |
|---|---|---|
| 6,329,240 B1 * | 12/2001 | Hsu et al. ..................... 438/253 |
| 6,509,606 B1 * | 1/2003 | Merrill et al. ................ 257/321 |
| 6,785,165 B2 * | 8/2004 | Kawahara et al. ...... 365/185.28 |
| 6,808,169 B2 * | 10/2004 | Hsu et al. ..................... 257/315 |

* cited by examiner

*Primary Examiner*—David Nhu
(74) *Attorney, Agent, or Firm*—Winston Hsu (57) ABSTRACT

A method for programming a single-poly EPROM cell at relatively low operation voltages (±Vcc) is disclosed. According to this invention, the single-poly EPROM cell includes a P-channel floating-gate transistor formed on an N well of a P type substrate, and an N-channel coupling device. The P-channel floating-gate transistor has a $P^+$ doped drain, $P^+$ doped source, a P channel defined between the $P^+$ doped drain and $P^+$ doped source, a tunnel oxide layer on the P channel, and a floating doped poly gate disposed on the tunnel oxide layer. The N-channel coupling device includes a floating poly electrode, which is electrically connected to the floating doped poly gate of the P-channel floating-gate transistor, and is capacitively coupled to a control region doped in the P type substrate.

16 Claims, 6 Drawing Sheets

METHOD FOR PROGRAMMING SINGLE-POLY EPROM AT LOW OPERATION VOLTAGES

BACKGROUND OF INVENTION

1. Field of the Invention

The present invention relates to a method for operating a non-volatile memory cell, and more particularly to a method for programming an electrical programmable read only memory (EPROM) cell at low operation voltages.

2. Description of the Prior Art

Single-poly electrical programmable read only memory (EPROM) devices or one-time programmable (OTP) read only memory devices are known in the art. A single-poly EPROM cell is a non-volatile storage device, which is fabricated using process steps that are fully compatible with conventional single-poly CMOS fabrication process steps. As a result, single-poly EPROM cells are often embedded in CMOS logic and mixed-signal circuits.

To save battery power of portable devices, low-voltage operations for EPROM are desired. Prior art such as U.S. Pat. No. 5,761,126 filed Feb. 7, 1997 by Chi et al. entitled "Single-poly EPROM cell that utilizes a reduced programming voltage to program the cell" discloses a single-poly EPROM cell that utilizes a reduced programming voltage to program the cell. The layout and the programming voltage of the single-poly EPROM cell are reduced by eliminating the $N^+$ contact region which is conventionally utilized to place a positive voltage on the N-well of the cell, and by utilizing a negative voltage of 6V~7V to program the cell. The negative voltage is applied to a $P^+$ contact region formed in the N-well, which injects electrons directly onto the floating gate of the cell.

U.S. Pat. No. 6,130,840 filed Apr. 28, 1999 by Bergemont et al. entitled "Memory cell having an erasable Frohmann-Bentchkowsky memory transistor" discloses a memory cell having an erasable Frohmann-Bentchkowsky P-channel memory transistor and an N-channel MOS access transistor. Eraseability is provided by utilizing a P-well which is formed adjacent to the memory transistor, and a floating gate which is formed over both the channel of the memory transistor and the P-well. With a physical gate length of 0.35 microns based on a 0.35-micron design rule, an operation voltage of 5.75 volts is applied to well and source region of the memory cell.

U.S. Pat. No. 6,509,606 filed Apr. 1, 1998 by Merrill et al. entitled "Single poly EPROM cell having smaller size and improved data retention compatible with advanced CMOS process" discloses a single-poly EPROM cell that does not incorporate oxide isolation and thereby avoids problems with leakage along the field oxide edge that can lead to degraded data retention. Leakage of a single-poly EPROM cell is prevented by eliminating field oxide isolating the source, channel, and drain from the control gate n-well, and by replacing field oxide surrounding the cell with a heavily doped surface isolation region.

However, conventional methods for programming the single-poly EPROM are still operated at voltages that are relatively higher than Vcc (input/output supply voltage), for example, a high voltage of about 5~7V that is higher than typical Vcc=3.3V, thus requiring additional high-voltage circuitry and high-voltage devices thereof. Further, conventional single-poly EPROM technology needs a large cell size and a high voltage to capacitively couple the floating gate for programming the memory cell.

SUMMARY OF INVENTION

The primary object of the present invention is to provide a method for efficiently programming a single-poly EPROM cell at ±Vcc (for example: Vcc=3.3V) voltage conditions.

According to the claimed invention, a method for programming a single-poly electrical programmable read only memory (EPROM) cell is provided. The single-poly EPROM cell comprises a P-channel floating gate transistor on an isolated N-well of a P-type substrate, and an N-channel coupling device. The P-channel floating gate transistor comprises $P^+$ drain, $P^+$ source, P channel defined between the $P^+$ drain and $P^+$ source, tunnel oxide on the P channel, and doped ploysilicon floating gate on the tunnel oxide. The N-channel coupling device comprises a polysilicon floating electrode that is electrically connected to the doped ploysilicon floating gate and is capacitively coupled to a control doped region formed in the P-type substrate. The method comprises: grounding the P-type substrate; grounding the N-well; biasing the $P^+$ drain of the P-channel floating gate transistor to a negative voltage; grounding or floating the $P^+$ source of the P-channel floating gate transistor; and applying a positive voltage on the control doped region so that the positive voltage being coupled to the P-doped ploysilicon floating gate. The P channel of the P-channel floating gate transistor is in "OFF" state, and a depletion region and electron-hole pairs are created at a junction between the $P^+$ drain and the N well, and band-to-band tunneling (BTBT) induced hot electrons will inject into the doped ploysilicon floating gate by tunneling through the tunnel oxide.

According to one aspect of the present invention, the method comprises: grounding the P-type substrate; grounding the N-well; applying a negative voltage of −Vcc to the $P^+$ drain of said P-channel floating gate transistor; applying a parasitic BJT turn-on voltage to the $P^+$ source of the P-channel floating gate transistor; and applying a positive voltage of +Vcc to the control doped region so that the positive voltage of +Vcc being coupled to the doped ploysilicon floating gate.

Other objects, advantages and novel features of the invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings:

FIG. 5 and FIG. 6 are schematic cross-sectional diagrams showing another preferred embodiment for programming the single-poly EPROM cell of FIG. 1 at low voltages, wherein

DETAILED DESCRIPTION

The present invention is directed to a feasible method for operating a memory cell, particularly to a single-poly EPROM cell that is capable of being programmed at high speed and low voltages such as ±Vcc.

Figure 1:
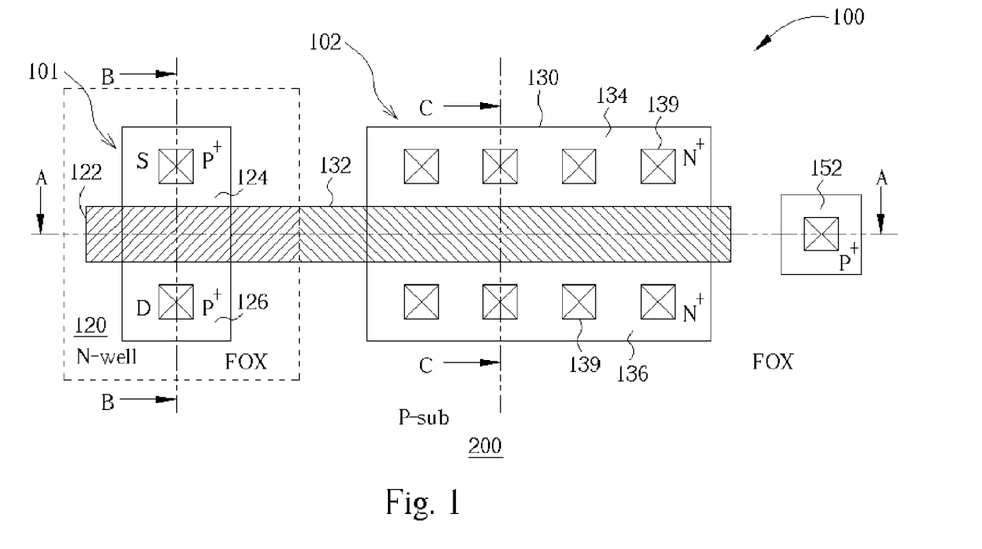
FIG. 1 shows a plan view of a single-poly EPROM cell according to this invention.
Figure 2:
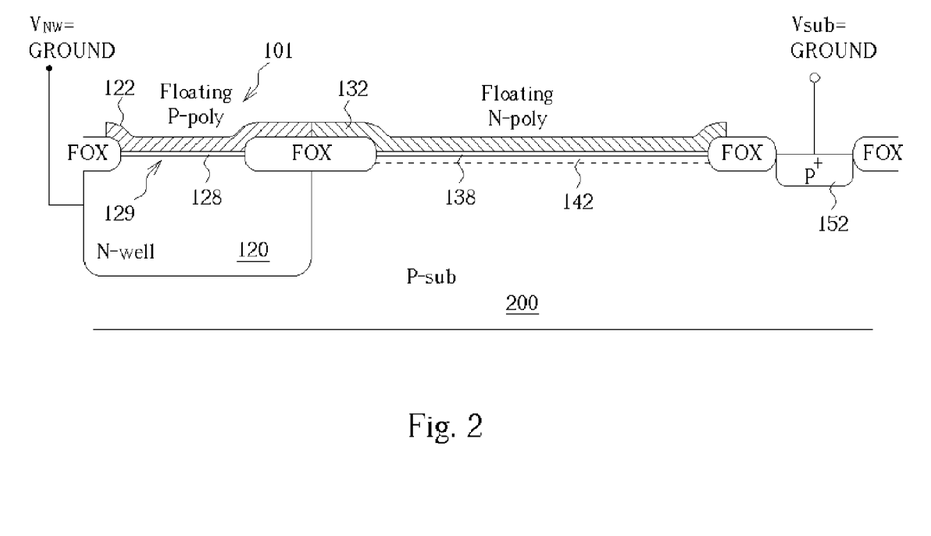
FIG. 2 shows a cross-sectional view of the single-poly EPROM cell taken along line A—A of FIG. 1.
Figure 3:
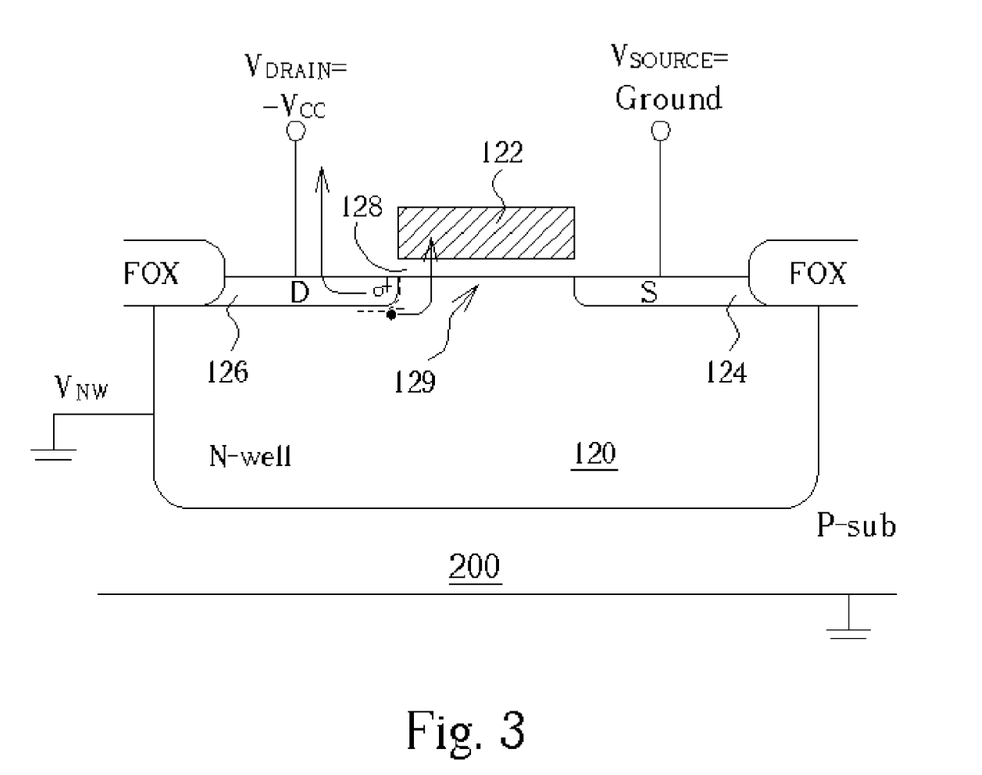
FIG. 3 shows a cross-sectional view of the single-poly EPROM cell taken along line B—B of FIG. 1.
Figure 4:
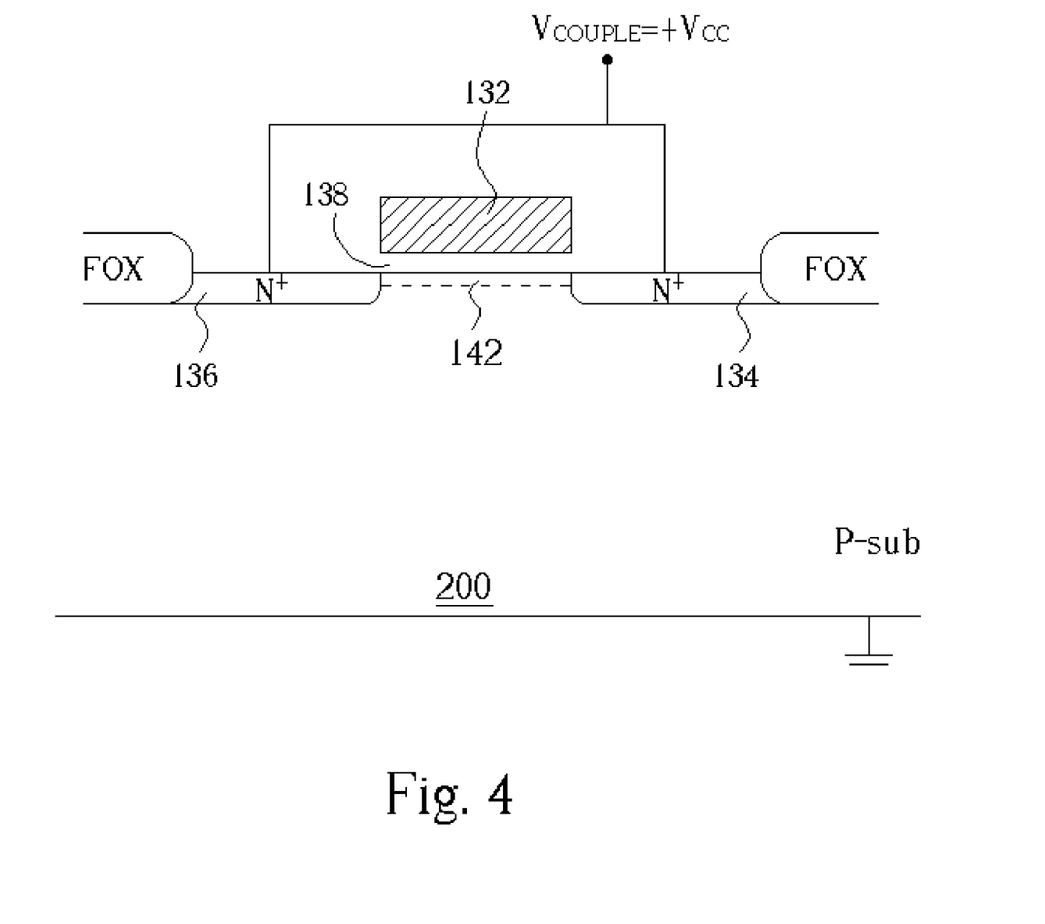
FIG. 4 shows a cross-sectional view of the single-poly EPROM cell taken along line C—C of FIG. 1.

A preferred embodiment in accordance with the present invention will now be explained in detail with reference to the attached schematic diagrams: FIG. 1 to FIG. 4, wherein FIG. 1 shows a plan view of a single-poly EPROM cell 100 according to this invention, FIG. 2 shows a cross-sectional view of the single-poly EPROM cell 100 taken along line A—A of FIG. 1, FIG. 3 shows a cross-sectional view of the single-poly EPROM cell 100 taken along line B—B of FIG. 1, while FIG. 4 shows a cross-sectional view of the single-poly EPROM cell 100 taken along line C—C of FIG. 1.

First, referring to FIG. 1, FIG. 2 and FIG. 3, the single-poly EPROM cell 100 of this invention comprises a P-channel floating gate transistor 101 comprising spaced-apart P$^+$ source and P$^+$ drain regions 124 and 126, which are doped in the N well 120. As best seen in FIG. 3, a P channel 129 is defined between the P+ source region 124 and P$^+$ drain regions 126. The active area consisting of the P$^+$ source region 124, P$^+$ drain regions 126 and the P channel 129 is isolated by field oxide (FOX). It is to be understood that the field oxide may be replaced with other isolation means such as shallow trench isolation (STI) in other cases. As best seen in FIG. 2, in accordance with the preferred embodiment, the N well 120 is formed in a P-type silicon substrate 200. The single-poly EPROM cell 100 further comprises a tunnel oxide film 128 formed on the P channel 129. A doped floating poly gate 122 overlies the tunnel oxide film 128. The P$^+$ source region 124 and P+drain regions 126 are formed at two sides of the doped floating poly gate 122 after the floating poly gate 122 being patterned. According to the preferred embodiment of this invention, the tunnel oxide film 128 has a thickness of about 65 angstroms.

Referring to FIG. 1, FIG. 2 and FIG. 4, the doped floating poly gate 122 laterally extends to the FOX and is contiguous with a polysilicon floating electrode 132 of a capacitive coupling device 102. According to the preferred embodiment of the present invention, the polysilicon floating electrode 132 is N-type doped poly gate and is patterned simultaneously with the floating poly gate 122. The polysilicon floating electrode 132 covers a portion of the FOX and runs across an N-channel coupling area 130 that is formed in the P-type silicon substrate 200 and is isolated by FOX. As best seen in FIG. 2 and FIG. 4, a dielectric layer 138 such as silicon dioxide is disposed between the polysilicon floating electrode 132 and the P-type substrate 200. It is understood that other suitable gate dielectric such as oxynitride may be employed. According to the preferred embodiment, the dielectric layer 138 is 65 Å silicon dioxide and is thermally formed simultaneously with the tunnel oxide film 128. N$^+$ control regions 134 and 136 are formed in the P-type silicon substrate 200 within the N-channel coupling area 130 at both sides of the polysilicon floating electrode 132. The N$^+$ control regions 134 and 136 are electrically connected to each other by, for example, interconnections. A plurality of contact devices 139 are disposed on the N$^+$ control regions 134 and 136 for connecting the N+control regions 134 and 136 with operation voltage signals. According to the preferred embodiment, an N$^-$ doped region 142 is implanted into the P-type substrate 200 under the polysilicon floating electrode 132. As shown in FIG. 1 and FIG. 2, the P-type silicon substrate 200 is biased to a substrate voltage V$_{sub}$ through a P$^+$ pick-up contact region 152.

One preferred method for programming the single-poly EPROM cell 100 will be explained with reference to FIG. 2 to FIG. 4. In programming operation, a source voltage V$_{SOURCE}$ is applied to the P$^+$ source region 124, a drain voltage V$_{DRAIN}$ is applied to the P$^+$ drain region 126, a well voltage V$_{NW}$ is applied to the N well 120, and a couple voltage V$_{COUPLE}$ is applied to the electrically connected N$^+$ control regions 134 and 136. The P-type silicon substrate 200 is connected to V$_{sub}$. According to the preferred embodiment, V$_{SOURCE}$=GROUND or FLOATING, V$_{DRAIN}$=−Vcc, V$_{NW}$=GROUND, V$_{COUPLE}$=Vcc, wherein Vcc is about 3.0V~5V. In a case that Vcc=3.3V (typical supply voltage for I/O circuit), by way of example, the voltage conditions are: V$_{COUPLE}$=+3.3V, V$_{SOURCE}$=0V, V$_{DRAIN}$=−3.3V, V$_{NW}$=0V, and V$_{sub}$=0V.

Since the N-channel coupling area 130 is much larger than the area of the P-channel floating gate transistor 101, therefore the coupling ratio is approximately equal to 1.0. As a result, the voltage coupled from the N$^+$ control regions 134 and 136 to the floating polysilicon electrode 132 will be close to 3.3V. Since the floating polysilicon electrode 132 is contiguous with the floating poly gate 122 of the P-channel transistor 101, thus in programming operation, a positive voltage of about 3.3V will be coupled to the floating poly gate 122. Under the above-described voltage conditions, as specifically indicated in FIG. 3, the P channel 129 of the transistor 101 is in "OFF" state, and a depletion region and electron-hole pairs are created at the junction between the P$^+$ drain 126 and the N well 120, and band-to-band tunneling (BTBT) induced hot electrons will inject into the floating poly gate 122 by tunneling through the tunnel oxide film 128.

Figure 5:
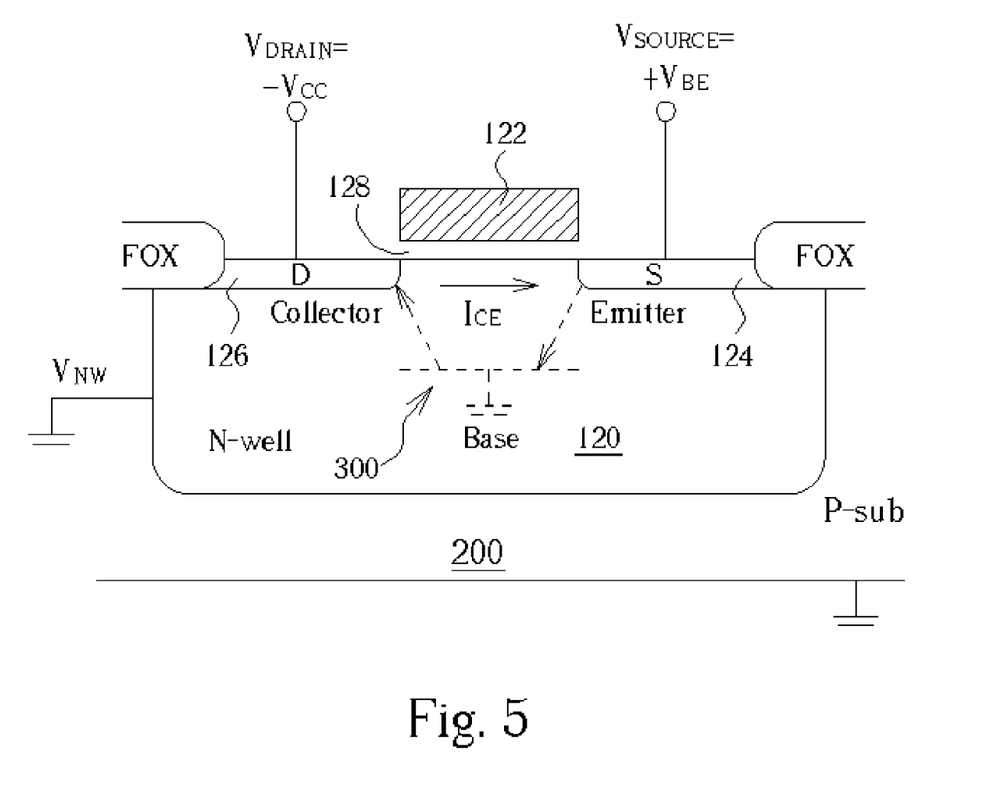
FIG. 5 shows a cross-sectional view of the single-poly EPROM cell taken along line B—B of FIG. 1.
Figure 6:
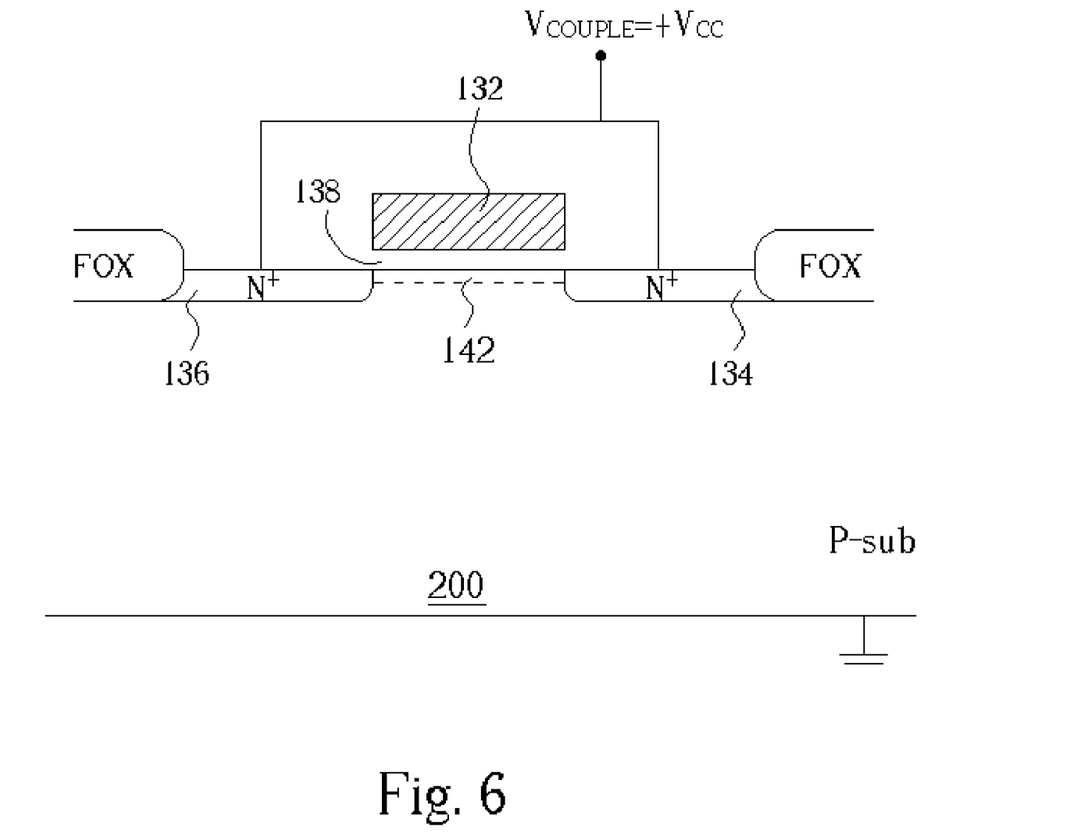
FIG. 6 shows a cross-sectional view of the single-poly EPROM cell taken along line C—C of FIG. 1.

Please refer to FIG. 5 and FIG. 6. FIG. 5 and FIG. 6 are schematic cross-sectional diagrams showing another preferred embodiment for programming the single-poly EPROM cell of FIG. 1 at low voltages, wherein FIG. 5 shows a cross-sectional view of the single-poly EPROM cell taken along line B—B of FIG. 1; and FIG. 6 shows a cross-sectional view of the single-poly EPROM cell taken along line C—C of FIG. 1. In programming operation, likewise, a source voltage V$_{SOURCE}$ is applied to the P$^+$ source region 124, a drain voltage V$_{DRAIN}$ is applied to the P$^+$ drain region 126, a well voltage V$_{NW}$ is applied to the N well 120, and a couple voltage V$_{COUPLE}$ is applied to the electrically connected N$^+$ control regions 134 and 136. The P-type silicon substrate 200 is connected to V$_{sub}$. According to this preferred embodiment, V$_{SOURCE}$=+V$_{BE}$, V$_{DRAIN}$=−Vcc, V$_{NW}$=GROUND (or V$_{NW}$=0V), V$_{COUPLE}$=Vcc, wherein Vcc is about 3.0V~5V; V$_{BE}$ is a positive voltage that is larger than 0V. In a case that Vcc=3.3V (typical supply voltage for I/O circuit), by way of example, the voltage conditions are: V$_{COUPLE}$=+3.3V, V$_{SOURCE}$=0.7V, V$_{DRAIN}$=−3.3V, V$_{NW}$=0V, and V$_{sub}$=0V.

Since the N-channel coupling area 130 is much larger than the area of the P-channel floating gate transistor 101, therefore the coupling ratio is approximately equal to 1.0. As a result, the voltage coupled from the N$^+$ control regions 134 and 136 to the floating polysilicon electrode 132 will be approximately 3.3V. Since the floating polysilicon electrode 132 is contiguous with the floating poly gate 122 of the P-channel transistor 101, thus in programming operation, a positive voltage of about 3.3V will be coupled to the floating poly gate 122. Under the above-described voltage conditions, as specifically indicated in FIG. 5, the P channel 129 of the transistor 101 is in "OFF" state, and a depletion region and electron-hole pairs are created at the junction between the P⁺ drain 126 and the N well 120, and band-to-band tunneling (BTBT) induced hot electrons will inject into the floating poly gate 122 by tunneling through the tunnel oxide film 128. According to this preferred embodiment, a positive voltage of about +0.7V is applied to P⁺ source region 124. The forward bias at the P-N junction (P⁺ source region 124 and N well 120) turns on a parasitic bipolar junction transistor (parasitic BJT) 300, wherein the P⁺ source region 124 acts as an emitter of the parasitic BJT 300, the P⁺ drain region 126 acts as an collector of the parasitic BJT 300, and the N well 120 acts as a base of the parasitic BJT 300. In practice, the magnitude of $V_{BE}$, which is adequate to turn on the parasitic BJT 300, depends on the P-N junction condition (P⁺ source region 124 and N well 120). It is advantageous that when the parasitic BJT 300 is turned on, a large collector-emitter current $I_{CE}$ with abundant electrons flow will supply the electron hole pairs at the drain terminal, thereby enhancing BTBT tunneling, and thus effectively reducing the programming voltage.

The program disturbance can be inhibited by setting unselected $V_{COUPLE}$ to 0V. In such case, the gate to drain voltage difference will not be high enough to generate band-to-band tunneling induced hot electron injection. Accordingly, select gate (SG) for program voltage inhibition is not necessary.

Further, in another embodiment, depending on the tunnel oxide thickness and criteria of program speed, the memory cell 100 may be programmed at $V_{COUPLE}$=Vcc~2Vcc. The memory cell 100 may be erased by ultraviolet irradiation (acts as an OTP cell), while in another case, F-N tunneling electrical erasure may be possible (acts as an EEPROM cell) if giving a high positive voltage on N well 120, drain 126, source 124, and grounding the control regions 134 and 136.

Those skilled in the art will readily observe that numerous modification and alterations of the device may be made while retaining the teachings of the invention. Accordingly, the above disclosure should be construed as limited only by the metes and bounds of the appended claims.

What is claimed is:

1. A method for programming a single-poly electrical programmable read only memory (EPROM) cell, said single-poly EPROM cell comprising a P-channel floating gate transistor on an isolated N-well of a P-type substrate, and an N-channel coupling device, wherein said P-channel floating gate transistor comprises P⁺ drain, P⁺ source, P channel defined between said P⁺ drain and P⁺ source, tunnel oxide on said P channel, and doped polysilicon floating gate on said tunnel oxide, and wherein said N-channel coupling device comprises a polysilicon floating electrode that is electrically connected to said doped polysilicon floating gate and is capacitively coupled to a control doped region formed in said P-type substrate, the method comprising:

grounding said P-type substrate;
grounding said N-well;
biasing said P⁺ drain of said P-channel floating gate transistor to a negative voltage;
grounding or floating said P⁺ source of said P-channel floating gate transistor; and
applying a positive voltage on said control doped region so that said positive voltage being coupled to said P-doped polysilicon floating gate, wherein said P channel of said P-channel floating gate transistor is in "OFF" state, and a depletion region and electron-hole pairs are created at a junction between said P⁺ drain and said N well, and band-to-band tunneling (BTBT) induced hot electrons will inject into said doped polysilicon floating gate by tunneling through said tunnel oxide.

2. The method for programming a single-poly EPROM cell according to claim 1 wherein said positive voltage applied on said control doped region is Vcc.

3. The method for programming a single-poly EPROM cell according to claim 2 wherein Vcc=+3.3V.

4. The method for programming a single-poly EPROM cell according to claim 1 wherein said positive voltage applied on said control doped region is Vcc~2Vcc.

5. The method for programming a single-poly EPROM cell according to claim 1 wherein said negative voltage is –Vcc.

6. The method for programming a single-poly EPROM cell according to claim 1 wherein said negative voltage is –3.3V.

7. The method for programming a single-poly EPROM cell according to claim 1 wherein a field oxide layer is disposed between said control doped region and said N well.

8. The method for programming a single-poly EPROM cell according to claim 1 wherein shallow trench isolation (STI) is disposed between said control doped region and said N well.

9. The method for programming a single-poly EPROM cell according to claim 1 wherein said polysilicon floating electrode of said N-channel coupling device is N-type doped polysilicon floating electrode.

10. The method for programming a single-poly EPROM cell according to claim 1 wherein said tunnel oxide has a thickness of about 65 Å.

11. A method for programming a single-poly electrical programmable read only memory (EPROM) cell, said single-poly EPROM cell comprising a P-channel floating gate transistor on an isolated N-well of a P-type substrate, and an N-channel coupling device, wherein said P-channel floating gate transistor comprises P⁺ drain, P⁺ source, P channel defined between said P⁺ drain and P⁺ source, tunnel oxide on said P channel, and doped polysilicon floating gate on said tunnel oxide, and wherein said N-channel coupling device comprises a polysilicon floating electrode that is electrically connected to said doped polysilicon floating gate and is capacitively coupled to a control doped region formed in said P-type substrate, wherein said N-well is isolated from said control doped region, the method comprising:

grounding said P-type substrate;
grounding said N-well;
applying a negative voltage of –Vcc to said P⁺ drain of said P-channel floating gate transistor;
applying a parasitic BJT turn-on voltage to said P⁺ source of said P-channel floating gate transistor; and
applying a positive voltage of +Vcc to said control doped region so that said positive voltage of +Vcc being coupled to said doped polysilicon floating gate.

12. The method for programming a single-poly EPROM cell according to claim 11 wherein said parasitic BJT turn-on voltage is a positive voltage that is adequate to turn on a parasitic bipolar junction transistor, wherein said P⁺ source acts as an emitter, said P⁺ drain acts as an collector, and said N well acts as a base.

13. The method for programming a single-poly EPROM cell according to claim 12 wherein when said parasitic bipolar junction transistor is turned on, a large collector-emitter current $I_{CE}$ with abundant electrons flow will supply the electron hole pairs at said P⁺ drain junction, thereby enhancing BTBT tunneling.

14. The method for programming a single-poly EPROM cell according to claim 11 wherein said parasitic BJT turn-on voltage is about +0.7V.

15. The method for programming a single-poly EPROM cell according to claim 11 wherein Vcc=+3.3V.

16. The method for programming a single-poly EPROM cell according to claim 11 wherein said tunnel oxide has a thickness of about 65 Å.

* * * * *